(12) United States Patent
Judy

(10) Patent No.: US 11,166,532 B2
(45) Date of Patent: Nov. 9, 2021

(54) ELECTROMAGNETIC SHIELDED DRY BAG WITH MAGNETIC CLOSURE SYSTEM

(71) Applicant: Merakai, LLC, Santa Barbara, CA (US)

(72) Inventor: Ryan Judy, Santa Barbara, CA (US)

(73) Assignee: Merakai, LLC, Santa Barbara, CA (US)

( * ) Notice: Subject to any disclaimer, the term of this patent is extended or adjusted under 35 U.S.C. 154(b) by 0 days.

(21) Appl. No.: 17/118,483

(22) Filed: Dec. 10, 2020

(65) Prior Publication Data

US 2021/0169190 A1    Jun. 10, 2021

Related U.S. Application Data

(60) Provisional application No. 62/946,310, filed on Dec. 10, 2019.

(51) Int. Cl.
  *A45C 13/10* (2006.01)
  *H05K 9/00* (2006.01)
  *A45C 11/22* (2006.01)

(52) U.S. Cl.
  CPC .......... *A45C 13/1069* (2013.01); *A45C 11/22* (2013.01); *H05K 9/0009* (2013.01); *H05K 9/0043* (2013.01)

(58) Field of Classification Search
  CPC .......................... A45C 13/1069; H05K 9/0043
  See application file for complete search history.

(56) References Cited

U.S. PATENT DOCUMENTS 3,889,043 A    6/1975  Ducros
9,460,309 B2  10/2016  Zar et al.
(Continued)

FOREIGN PATENT DOCUMENTS

CN    204146519 U    2/2015

OTHER PUBLICATIONS

Title: RFID key fob pouch—car key signal blocking bag—protect against signal relaying—keyless entry systems—Faraday cage; URL: http://www.ibc-groups.com/45538/rfid-key-fob-pouch-car-key-signal-blocking-bag-protect-again; Accessed Aug. 31, 2018.

(Continued)

*Primary Examiner* — Hung V Ngo
(74) *Attorney, Agent, or Firm* — Lance M. Pritikin

(57) ABSTRACT

An exemplary electromagnetic shielded dry bag with magnetic closure system includes an outer bag, an inner shielding liner, and a pair of embedding strips having magnets embedded therein. The outer bag is preferably comprised of water-proof material and has a fluid-sealed floor portion and an access mouth disposed oppositely thereof. First and second bag panels are disposed oppositely of one another and extend from the floor portion to the access mouth. The inner shielding liner is comprised of electromagnetic shielding material and defines an electromagnetic shielding compartment within the bag. The embedding strips are secured to respective bag panels. This securement may be by way of heat fusing of respective securement elements to the inner faces, thereby forming pockets with which the strips reside. When the closure section is magnetically retained in closed configuration, the access mouth is thereby retained in an RF-sealed and fluid-sealed configuration to protect the shielding compartment.

12 Claims, 16 Drawing Sheets

(56) References Cited

U.S. PATENT DOCUMENTS

| | | | |
|---|---|---|---|
| 10,939,595 B1* | 3/2021 | Abouhatsira | H05K 9/009 |
| 2006/0201595 A1* | 9/2006 | Carmichael | A45F 5/00 |
| | | | 150/143 |
| 2008/0156833 A1* | 7/2008 | Espiritu | A45C 13/1069 |
| | | | 224/236 |
| 2010/0270070 A1* | 10/2010 | Bradley | H05K 9/0043 |
| | | | 174/378 |
| 2012/0128273 A1 | 5/2012 | Lytle | |
| 2012/0195530 A1 | 8/2012 | Kennedy | |
| 2013/0220694 A1* | 8/2013 | Wittman-Holloway | |
| | | | A45C 11/00 |
| | | | 174/378 |
| 2013/0243354 A1 | 9/2013 | Lytle | |
| 2014/0366250 A1 | 12/2014 | Barone et al. | |
| 2015/0047105 A1 | 2/2015 | Fonzo | |
| 2015/0052617 A1 | 2/2015 | Zar | |
| 2015/0053581 A1 | 2/2015 | Miller | |
| 2015/0289421 A1* | 10/2015 | Ho | H05K 9/0043 |
| | | | 361/679.21 |
| 2016/0007121 A1 | 1/2016 | Hung et al. | |
| 2017/0066559 A1 | 3/2017 | Kim et al. | |
| 2018/0220757 A1 | 8/2018 | Brundage | |
| 2019/0090390 A1* | 3/2019 | Judy | A45C 3/001 |

OTHER PUBLICATIONS

Silent pocket large faraday bag cage cell phone sleeve pouch—blocks all wireless signals; URL: https://www.amazon.com/Silent-Pocket-Medium-Faraday-Sleeve/dp/B017VOS0FE; Accessed Aug. 31, 2018.

\* cited by examiner

PRIOR ART

① Open the Bag

② Align and Close the Seal

③ Fold the Seal Over 3 Times

④ Plug Tight Buckle

ELECTROMAGNETIC SHIELDED DRY BAG WITH MAGNETIC CLOSURE SYSTEM

RELATED APPLICATIONS

This application claims the benefit of U.S. Provisional Application No. 62/946,310 filed Dec. 10, 2019, the content of which is incorporated by this reference in its entirety for all purposes as if fully set forth herein.

TECHNICAL FIELD

The present disclosure relates generally to the field of protective bags for electronic devices. More particularly, the present disclosure relates to closure systems for dry bags and electromagnetic shielding enclosures.

BACKGROUND

Most conventional dry bags on the market close with a roll and buckle method, as illustrated in FIG. 33. This two-part method of closure ensures that water does not enter into the bag. Many dry bags on the market with RF shielded liners may also use this method of closure, as it may be adequate for both blocking water from entering as well as blocking EMI/RF emissions. Manufacturing this method of closure is considered simple, cost-effective, and "tried-and-true." Therefore, manufacturers have largely maintained this method of closure. Various other conventional dry bags on the market may use other closure mechanisms, such as waterproof zippers, or even magnetic closures, but these are apparently less common and only employed for specific applications.

Certain conventional bags on the market with EMI/RF liners and water-resistant features (outer materials) that may employ a magnetic closure do exist. These magnetic closures, however, are different than the present invention in that they tend to use a "single flap" type closure with a strip magnet, instead of a double-roll type closure with stronger, neodymium magnets. This single flap closure can be easy to open and close, but the level of water-resistance of the entire bag is likely to be much lower. Because of this, these conventional bags may not really be considered as "dry bags." They simply use a water-resistant outer surface.

further issue with this type of conventional single flap closure may be that the EMI/RF liner can be easier to open and close, and therefore less secure. Devices inside of the bag may more easily impede the opening of the bag, allowing signal to penetrate. The closure flap may accidentally come open during transport, again allowing signal to enter or escape.

The two limitations mentioned above (less water resistant, less secure) may have been overcome with the invention. The double roll, flush, magnetic closure may allow a bag to be more water-resistant, while also securing the EMI/RF liner with a tighter seal that is more difficult to impede or open.

Applicant's earlier art provides examples of magnetic closures that include magnets laid on top of plastic boards. This can be cheaper, easier to sew the magnets into alignment, and perfectly sufficient to create an EMI/RF seal. It may not, however, allow the closure to be water-resistant or water-proof as liquid can escape through the spaces left from the difference between the heights of the magnets and the plastic boards underneath them.

Moreover, applicant's earlier art demonstrates a magnetic closure method where magnets are sewn into separate "pockets" on the closure to align them, while a plastic board is sewn below the magnets. Seams are used as the method of aligning the magnets. However, with dry bags, the use of seams for this purpose is far less practical or not possible if a water-resistant/water-tight seal is desired. Alignment of the magnets therefore becomes difficult.

BRIEF DESCRIPTION OF THE DRAWINGS

Further advantages of the present invention may become apparent to those skilled in the art with the benefit of the following detailed description of the preferred embodiments and upon reference to the accompanying drawings in which.

DETAILED DESCRIPTION OF THE PREFERRED EMBODIMENTS

Figure 1:
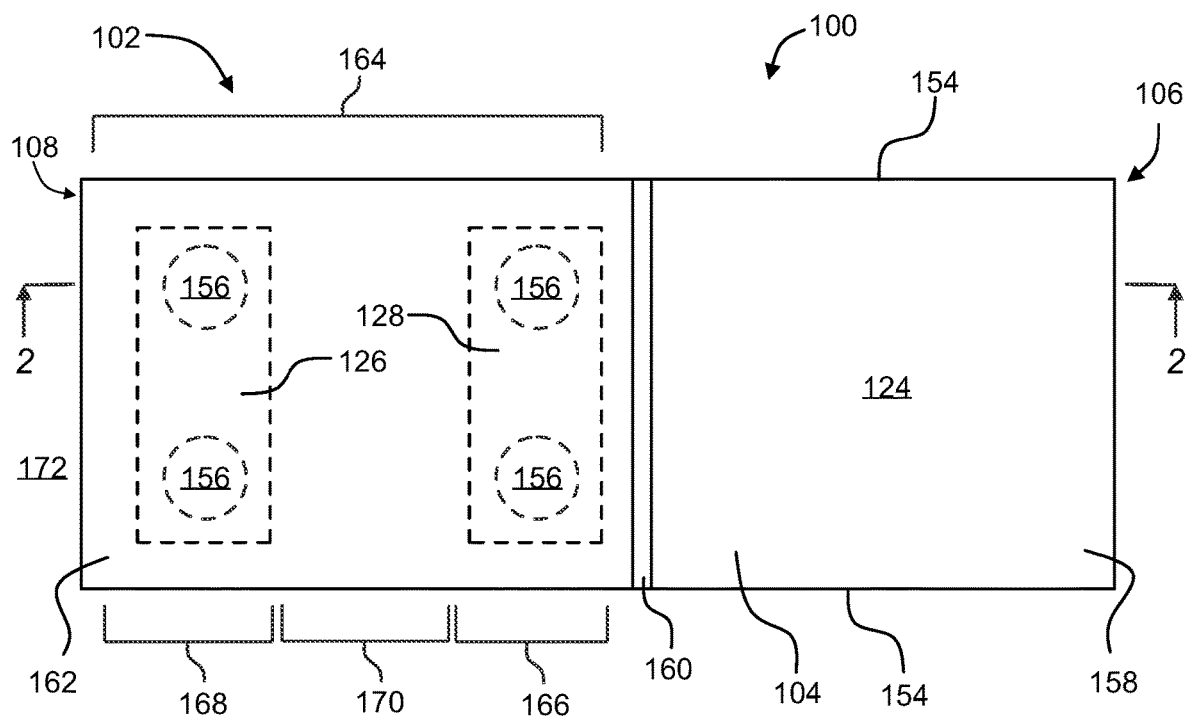
FIG. 1 is a diagrammatic top plan view of one non-limiting example of an electromagnetic shielded dry bag with magnetic enclosure system in accordance with the present disclosure.

Referring now to the drawings, like reference numerals designate identical or corresponding features throughout the several views.

Features of particular preferred embodiments of an electromagnetic shielded dry bag 100 with magnetic closure system 102 in accordance with the present disclosure are disclosed herein. However, alternate embodiments of the electromagnetic shielded dry bag may be constructed with fewer or more features and components than those shown and described in connection with the illustrated embodiments.

Figure 2:
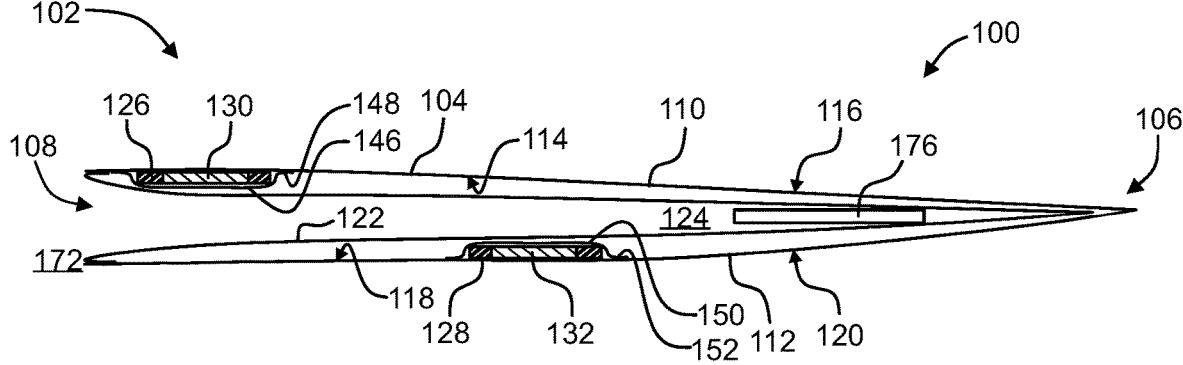
FIG. 2 is a diagrammatic cross-sectional view of the example electromagnetic shielded dry bag taken along lines 2-2 in FIG. 1.

Referring to FIGS. 1 and 2, a preferred embodiment of an electromagnetic shielded dry bag 100 with magnetic closure system 102 may comprise an outer bag element 104 and an inner shielding liner element 122. The outer bag element 104 may include a fluid-sealed floor portion 106, an access mouth 108 disposed oppositely thereof, a first bag panel 110 and a second bag panel 112 disposed oppositely of one another and extending from the floor portion 106 to the access mouth 108. The first bag panel 110 may have a first inner face 114 and first outer face 116. The second bag panel 112 may have a second inner face 118 and a second outer face 120. The inner shielding liner element 122 may be comprised of electromagnetic shielding material and define an electromagnetic shielding compartment 124 within the bag 100.

A first magnet element 130 may be embedded in a first embedding strip 126. A second magnet element 132 may be embedded in a second embedding strip 128. The first embedding strip 126 may be in a first securement with the first inner face 114, and the second embedding strip 128 may be in a second securement with the second inner face 118. The embedding strips may preferably be comprised of a polymer.

Figure 3:
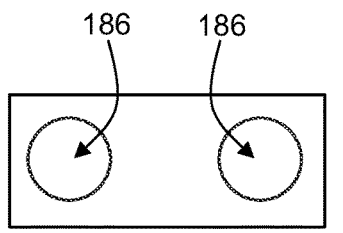
FIG. 3 is a diagrammatic top plan view of one non-limiting example of a first or second embedding strip in accordance with the present disclosure.
Figure 5:
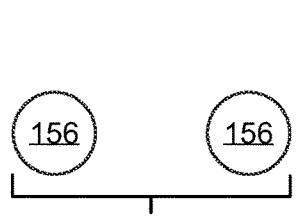
FIG. 5 is a diagrammatic top plan view of one non-limiting example of a first or second magnet element in accordance with the present disclosure, wherein the magnet element is shown including an example plurality of cylindrical magnets.
Figure 4:
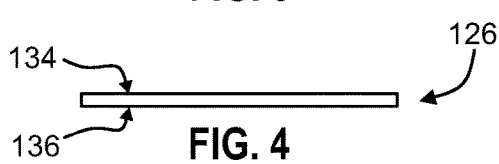
FIG. 4 is a diagrammatic front view of the example embedding strip of FIG. 3.
Figure 6:
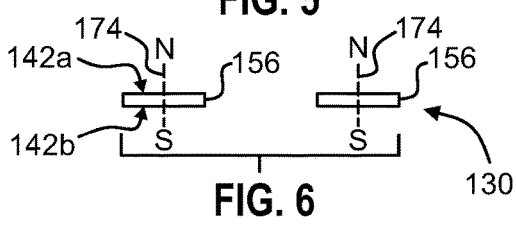
FIG. 6 is a diagrammatic front view of the example magnet element of FIG. 5.
Figure 7:
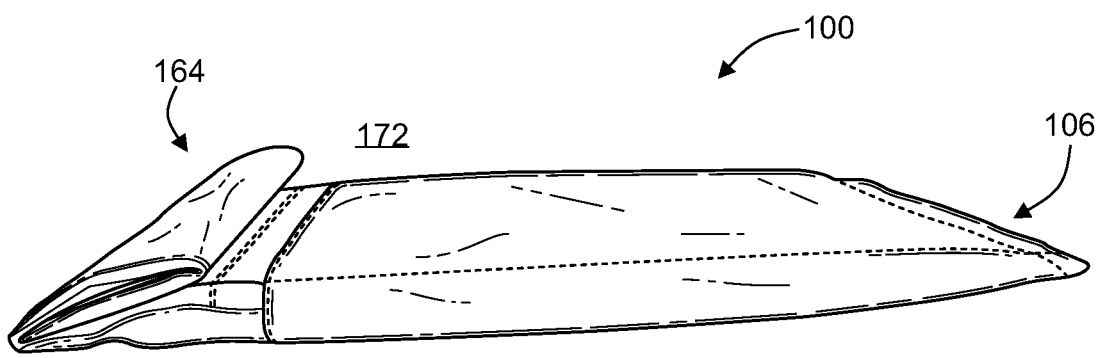
FIG. 7 is a diagrammatic perspective view of an example electromagnetic shielded dry bag with magnetic enclosure system in accordance with the present disclosure, shown with the closure section in a closed configuration.
Figure 8:
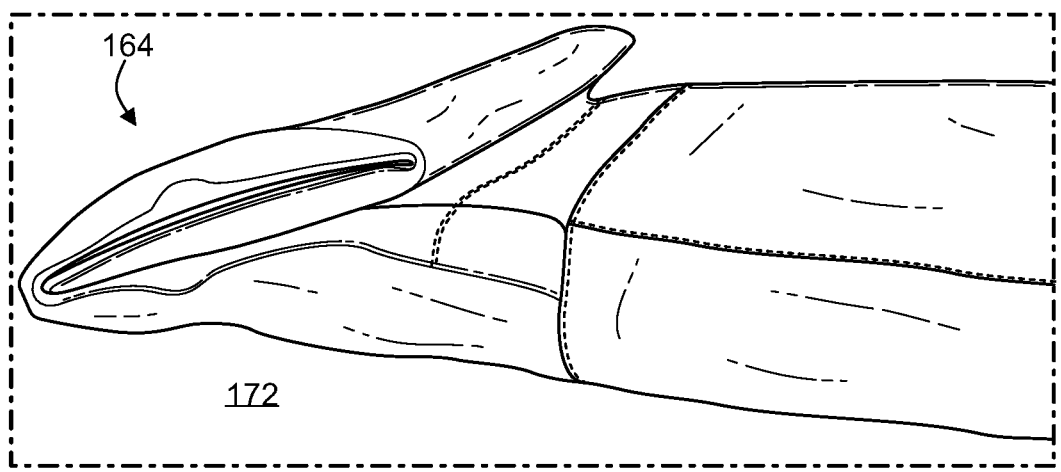
FIG. 8 is a diagrammatic magnified view of the closure section of the example electromagnetic shielded dry bag in FIG. 1.
Figure 9:
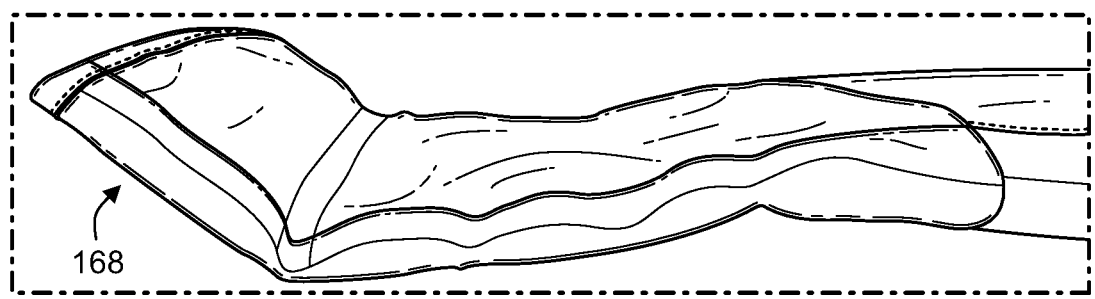
FIG. 9 is a diagrammatic magnified view of the closure section similar to FIG. 8, but wherein the closure section is in an open configuration.
Figure 10:
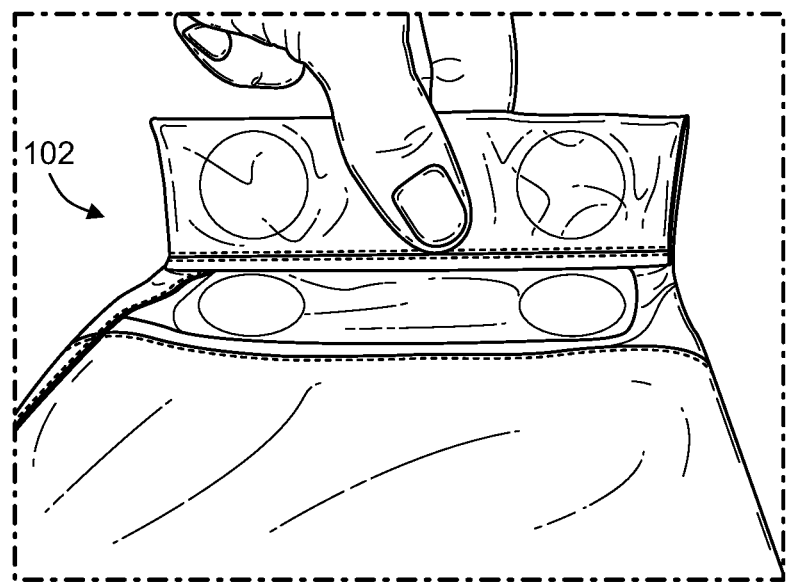
FIG. 10 is a diagrammatic partial perspective view of the example electromagnetic shielded dry bag of FIG. 7, wherein the distal segment is shown folded with respect to the intermediate flap segment, and the intermediate flap segment is shown partially folded with respect to the retention segment.
Figure 11:
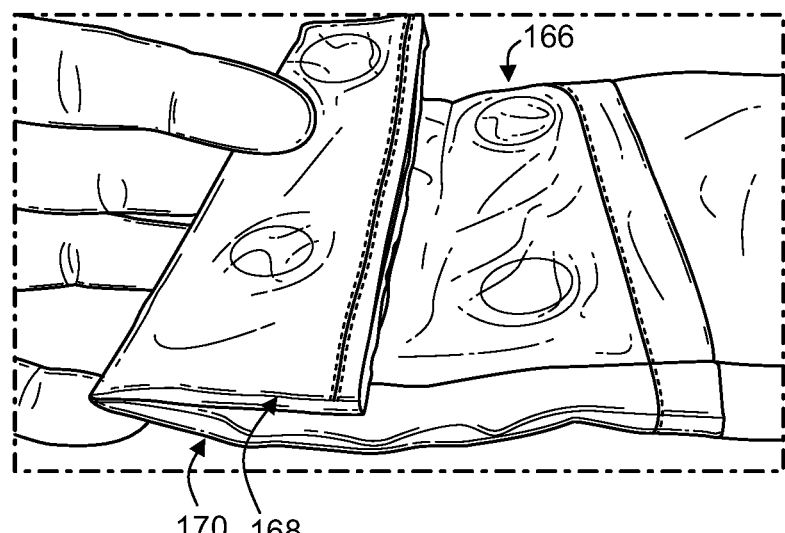
FIG. 11 is a diagrammatic partial perspective view of the example electromagnetic shielded dry bag of FIG. 7, wherein the distal flap segment is shown folded with respect to the intermediate flap segment.
Figure 12:
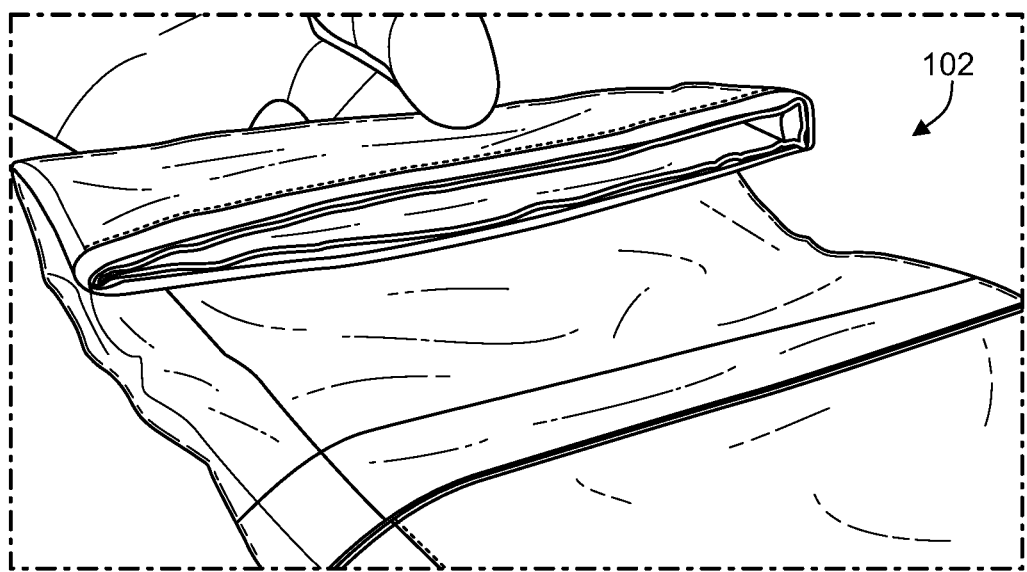
FIG. 12 is a diagrammatic partial perspective view of the configuration similar to FIG. 11, but shown from another angle.
Figure 13:
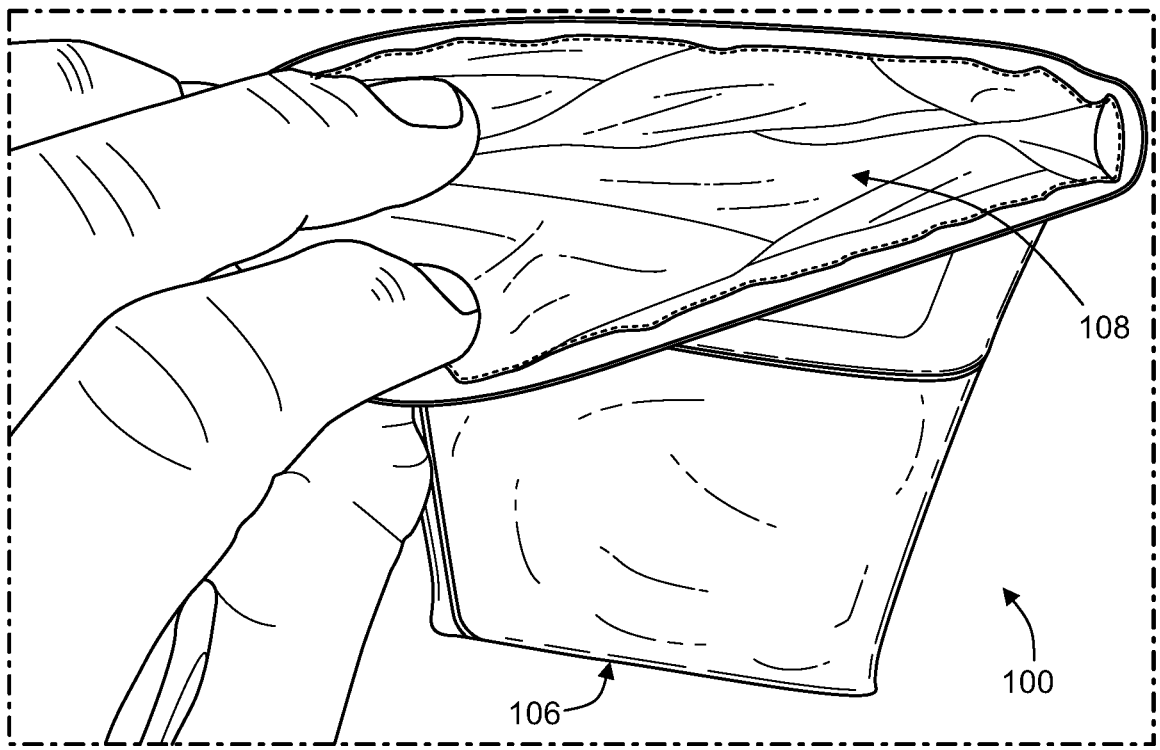
FIG. 13 is a diagrammatic partial perspective view of the example electromagnetic shielded dry bag of FIG. 7, showing the access mouth being manually opened.
Figure 14:
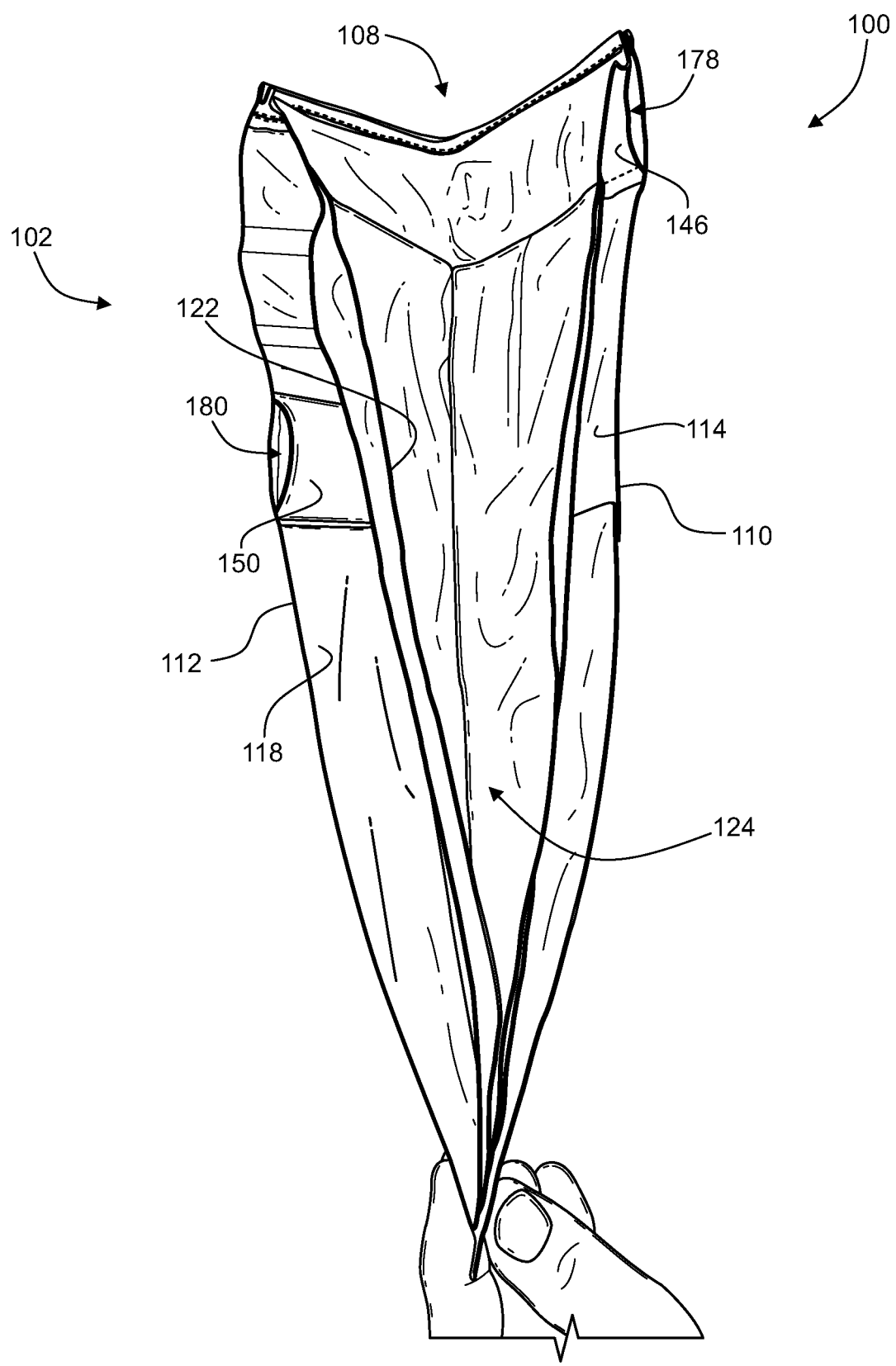
FIG. 14 is a diagrammatic view of the example electromagnetic shielded dry bag of FIG. 7 cut longitudinally in half, thereby revealing the construction and components of the bag.
Figure 15:
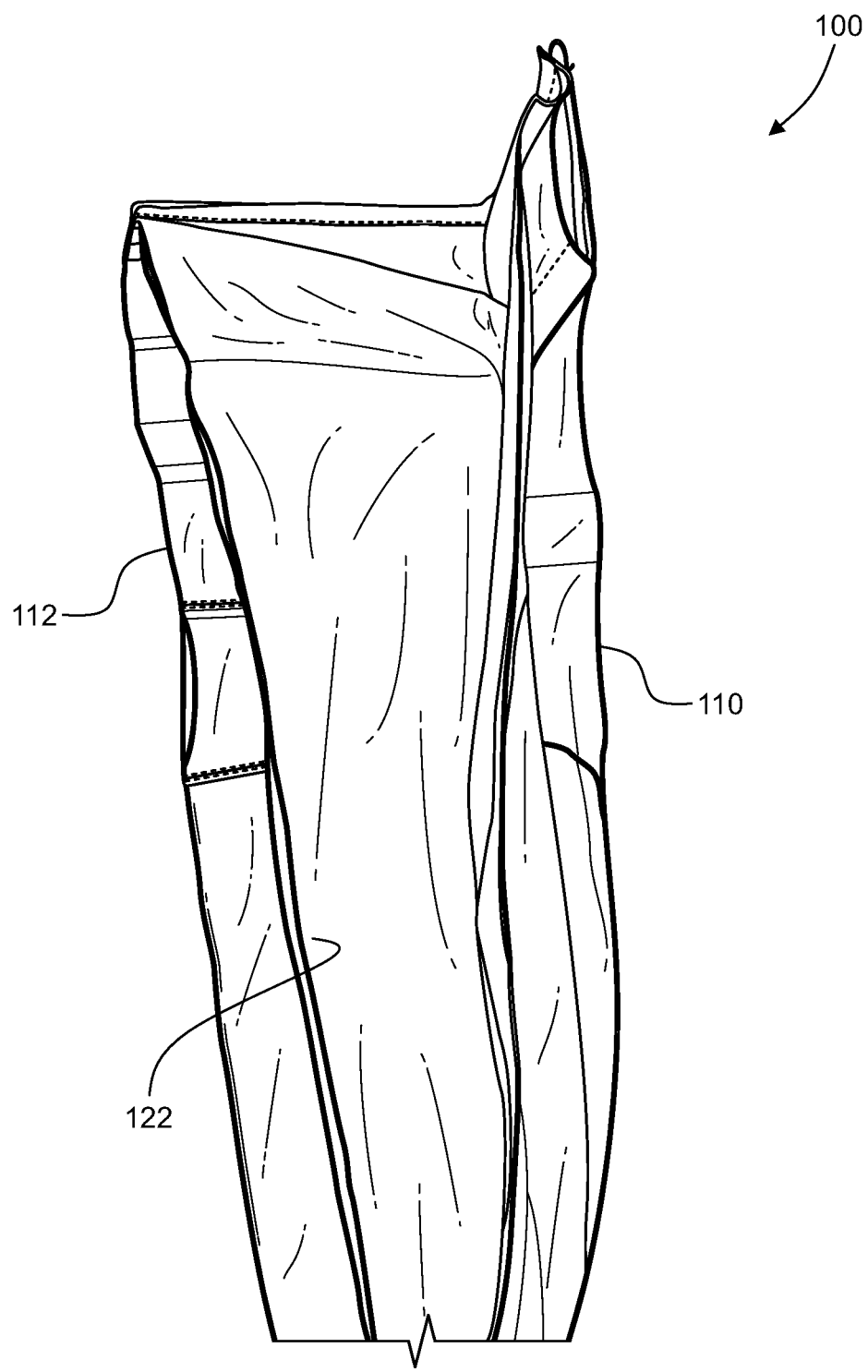
FIG. 15 is a further diagrammatic partial view of the example electromagnetic shielded dry bag of FIG. 7 cut longitudinally in half, thereby revealing the construction and components of the bag.
Figure 16:
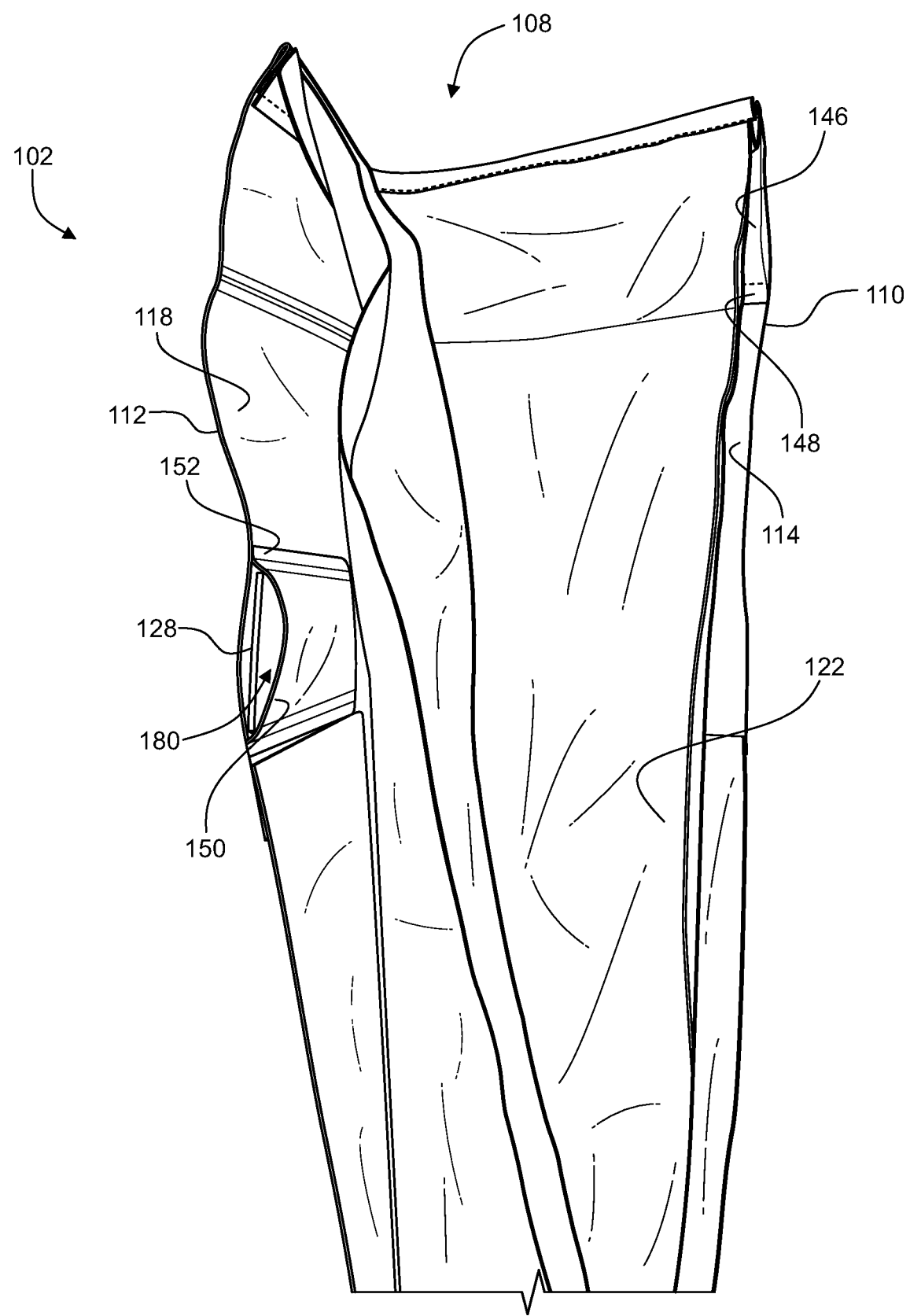
FIG. 16 is a further diagrammatic partial view of the example electromagnetic shielded dry bag of FIG. 7 cut longitudinally in half, thereby revealing the construction and components of the bag.
Figure 17:
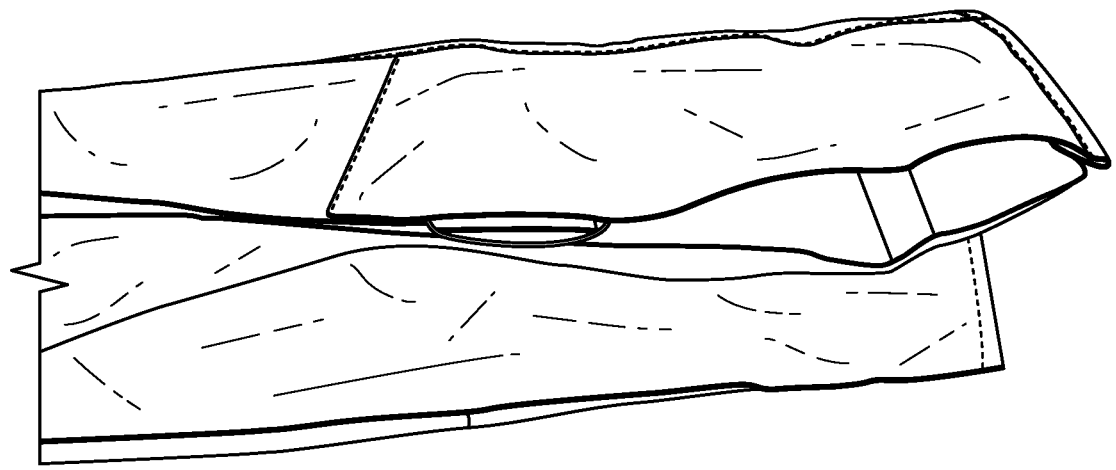
FIG. 17 is a further diagrammatic partial view of the example electromagnetic shielded dry bag of FIG. 7 cut longitudinally in half, thereby revealing the construction and components of the bag.
Figure 18:
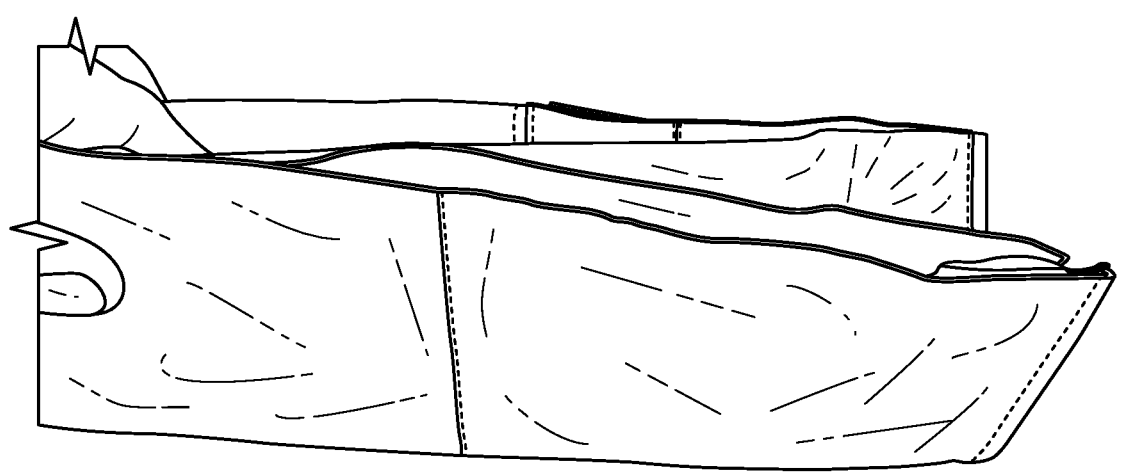
FIG. 18 is a further diagrammatic partial view of the example electromagnetic shielded dry bag of FIG. 7 cut longitudinally in half, thereby revealing the construction and components of the bag.
Figure 19:
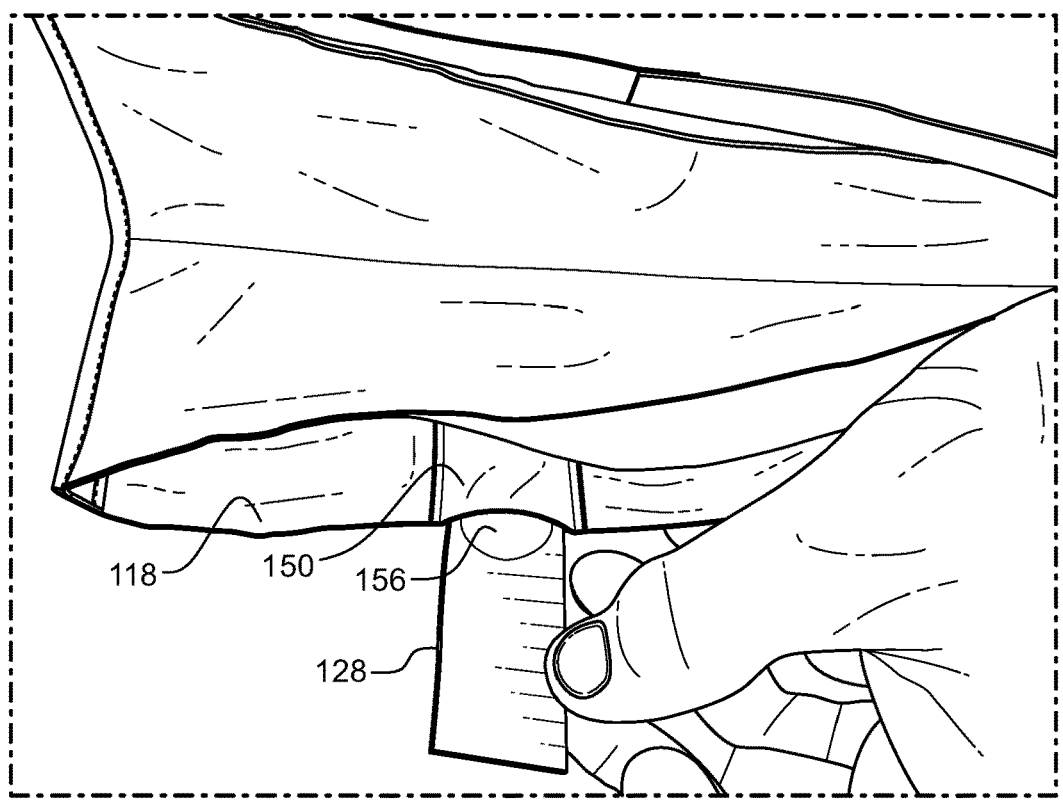
FIG. 19 is a further diagrammatic partial view of the example electromagnetic shielded dry bag of FIG. 7 cut longitudinally in half, thereby revealing the construction and components of the bag, also showing the second embedding strip partially removed from the pocket formed between the second inner face of the second bag panel and the second securement element.
Figure 20:
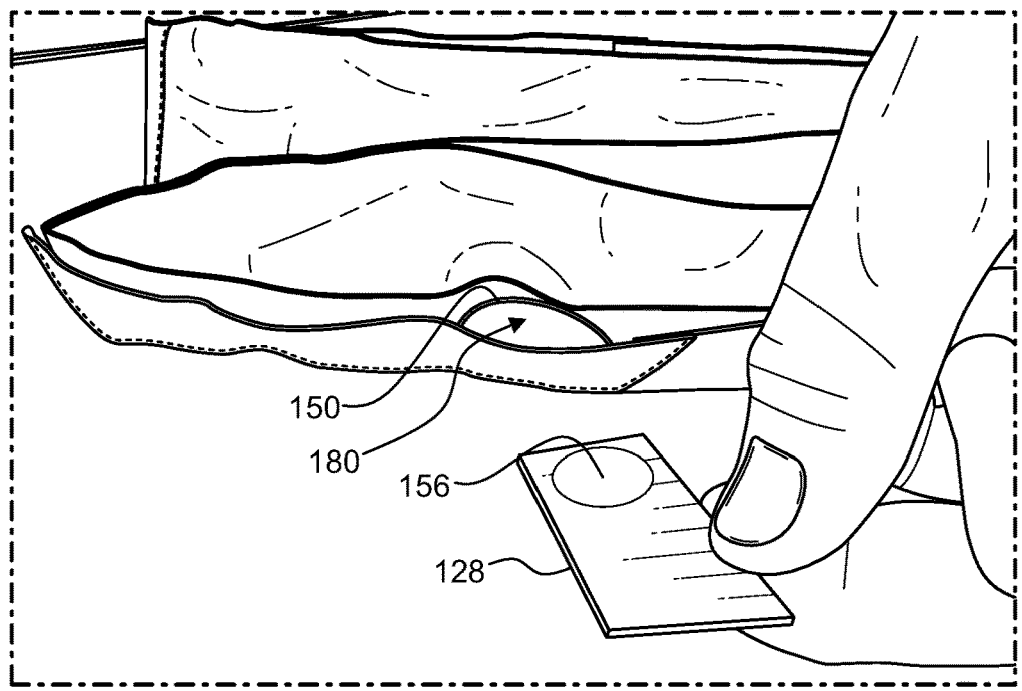
FIG. 20 is a diagrammatic partial view similar to that of FIG. 19, but showing the second embedding strip entirely removed from the pocket 180 formed between the second inner face of the second bag panel and the second securement element.

Referring to FIGS. 3 and 4, in certain preferred embodiments of the bag 100, the first embedding strip 126 may be flat planar and many have a first proximal face 134 and a first distal face 136 disposed oppositely of one another. Similarly, the second embedding strip 128 may be flat planar and may have a second proximal face 138 and a second distal face 140 disposed oppositely of one another. The embedding strips may include magnet-receiving apertures 186 configured to receive respective individual magnets 156 of the magnet elements. Referring to FIGS. 2 and 6, the first magnet element 130 may have a pair of first opposing pole faces (142a and 142b) that are respectively flush (e.g., substantially co-planar) with the first proximal face 134 and the first distal face 136. Similarly, the second magnet element 132 may have a pair of second opposing pole faces that are respectively flush (e.g., substantially co-planar) with the second proximal face and the second distal face.

Referring to FIG. 2, in particular preferred embodiments of the 100, the first securement may be by way of a first securement element 146 having, for example, a first securement periphery 148 heat fused, adhered, or otherwise affixed to the first inner face 114. Similarly, the second securement may be by way of a second securement element 150 having a second securement periphery 152 heat fused, adhered, or otherwise affixed to the second inner face 118.

Referring to FIG. 1, in certain preferred embodiments of the bag 100, the outer bag element 104 may include a pair of lateral edges 154 extending from the floor portion 106 to the access mouth 108. Referring to FIGS. 1 and 6, the first magnet element 130 may include a first plurality of cylindrical magnets 156 extending in linear alignment with one another between the lateral edges 154. Similarly, the second magnet element 132 may include a second plurality of cylindrical magnets 156 extending in linear alignment with one another between the lateral edges 154.

In particular preferred embodiments of the bag 100, the outer bag element 104 may be comprised of a waterproof material. Referring to FIG. 1, in certain embodiments of the bag 100, the outer bag element 104 may be comprised of a first waterproof material 158 extending from the floor portion 106 to a material interface segment 160, and a second waterproof material 162 extending from the access mouth 108 to the material interface segment 160. In such embodiments of the bag 100, the first and second waterproof materials may be materially distinct from one another (e.g., having distinct physical properties or composition). By way of example only, the first waterproof material 158 may be a 600D TPU and the second waterproof material 162 may be a 420D TPU. In certain alternate embodiments, these materials may be substituted with PVC or another waterproof or water-resistant material.

In certain preferred embodiments of the bag 100, the inner shielding liner element 122 may be secured to the outer bag element 104 at the access mouth 108. In particular such embodiments, other than at the access mouth 108, no stitching may exist between the inner shielding liner element 122 and the outer bag element 104.

Referring to FIGS. 1 and 2, in particular preferred embodiments of the bag 100, a closure section 164 may be defined between the shielding compartment 124 and the access mouth 108. The closure section 164 may include a retention segment 166, a distal flap segment 168, and an intermediate flap segment 170 therebetween. The distal flap segment 168 may be foldably associated with the intermediate flap segment 170, the intermediate flap segment 170 may be foldably associated with the retention segment 166, and the closure section 164 may be selectively actuatable between an open configuration and a closed configuration. When the closure section 164 is in the open configuration, the first magnet element 130 is out of attractive magnetic engagement with the second magnet element 132, and the shielding compartment 124 is accessible from an ambient environment 172 by way of the access mouth 108. In contrast, when the closure section 164 is in the closed configuration, the distal flap segment 168 is folded with respect to the intermediate flap segment 170, the intermediate flap segment 170 is folded with respect to the retention segment 166, the first magnet element 130 is in attractive magnetic engagement with the second magnet element 132, and the access mouth 108 is retained in an electromagnetically-sealed and water-blocking configuration. The electromagnetically-sealed configuration prevents (or significantly impedes) an electronic device 176 (e.g., cell phone or tablet computer) housed within the shielding compartment 124 from sending electromagnetic signals to the ambient environment 172 or receiving electronic signals from the ambient environment 172 through the bag 100 Water-blocking refers to preventing water from entering the electromagnetic shielding compartment 124 from the ambient environment, thereby protecting an electronic device 176 housed within the shielding compartment 124 from becoming water-damaged due to the presence of water in the ambient environment 172. In certain embodiments, the water-blocking configuration may be tight enough to be considered water-sealing.

Referring to FIGS. 2 and 6, the first magnet element 130 and the second magnet element 132 may each include a plurality of circular-cylindrical magnets 156, each of which may be axially-magnetized along a corresponding pole axis 174. In such embodiments, when the closure section 164 is in the closed configuration, the pole axis 174 of each magnet 156 of the first magnet element 130 is axially aligned with the pole axis 174 of a respective magnet 156 of the second magnet element 132.

Referring to FIGS. 8-13, certain preferred embodiments of the enclosure (otherwise referred to herein as a bag 100) may include a water-resistant outer material and an EMI/RF inner liner, with a closure (mouth) at the top of the enclosure. The magnetic closure may employ a "roll style" method of rolling the bag over twice to seal the main RF compartment, while also sealing the outer dry bag liner. In other embodiments, the top of the bag may roll over more than two times. The magnets may be inset into two opposing strips of material (a top strip and a bottom strip), such as plastic, which may connect when the mouth of the bag is rolled over twice. The top strip may contain two magnets, though more or less may be used in a straight line, while the bottom strip may contain the same number of magnets located in the same position as the top magnets. When the bag is rolled, the magnets can come together and cause the mouth of the bag to be sealed. When the magnets are inset into the strips of material, the closure method can allow the strips of material to become flush against each other in a straight line, providing an EMI/RF tight seal as well as a water-resistant seal.

Figure 25:
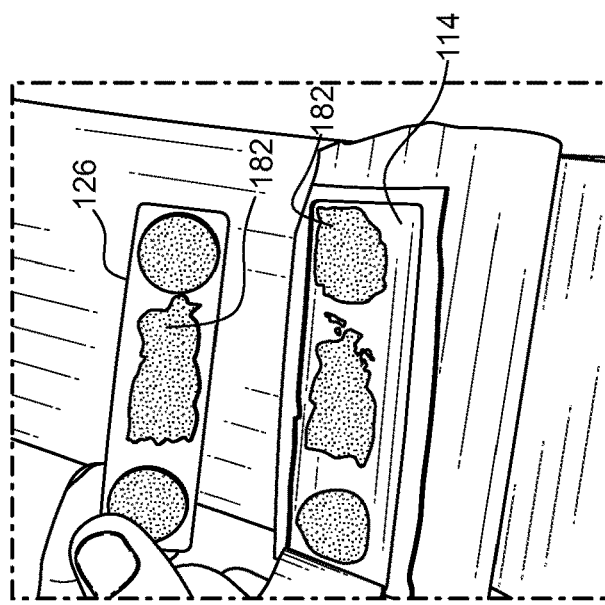

Referring to FIG. 25, the embedding strips may be cut in such a way as to allow magnets to be inset, and as such to become flush, with the strips of material. While magnetic strips do exist in the market, they may not offer as strong a connection as rare earth (neodymium) magnets. It may therefore be necessary for the magnets to become aligned with the strip horizontally, as well as vertically. Horizontal alignment can be important to allow the magnets to be flush with the material, so the closure of the bag does not contain any high or low points that may allow signal or water to penetrate. Vertical alignment may be important when the closure is rolled, to ensure that the magnets on the top strip align with the magnets on the bottom strip, forming a strong seal between both strips. In other embodiments, more than two strips of material may be used to form a seal, and different shapes or combinations of magnets may be used. Other embodiments may include strip magnets, or continuous magnets instead of individual magnets.

Figure 27:
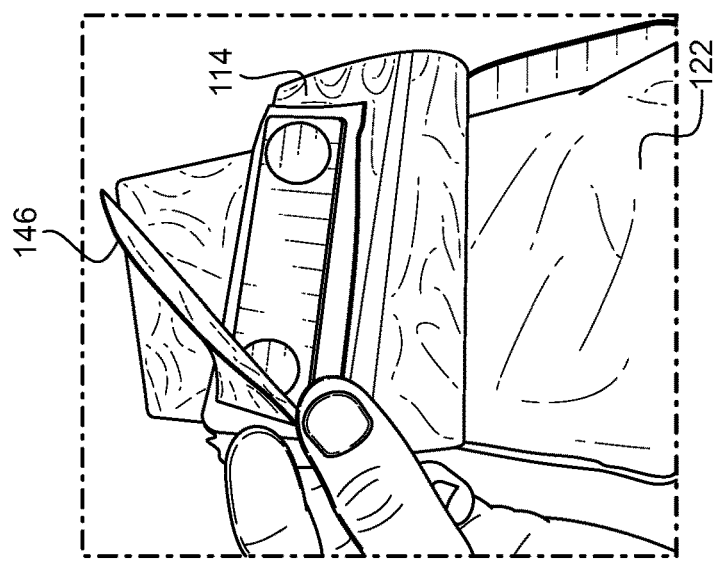
FIGS. 25-32 illustrate an embodiment of the electromagnetic shielded dry bag in various states of deconstruction, thereby revealing details of its construction and components.
Figure 26:
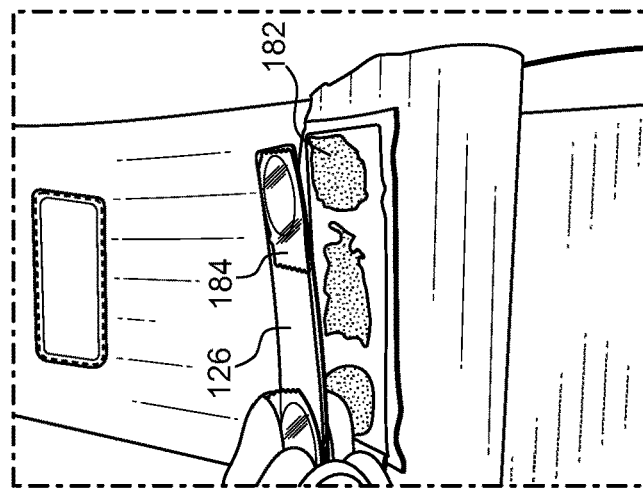

Referring to FIGS. 26 and 27, the embedding strips with the inset magnets may be temporarily attached to the inside of the outer water-resistant liner (herein referred to as a first or second bag panel) using glue, tape, or other means which can maintain the water-resistant nature of the outer material and position the strip for permanent securement. Other products in the market may attempt to align magnets to strips of material, or to attach the magnets or strips of material to the outer liner using sewing, but this method could penetrate the outer material and result in a product that is not waterproof or water-resistant.

Figure 21:
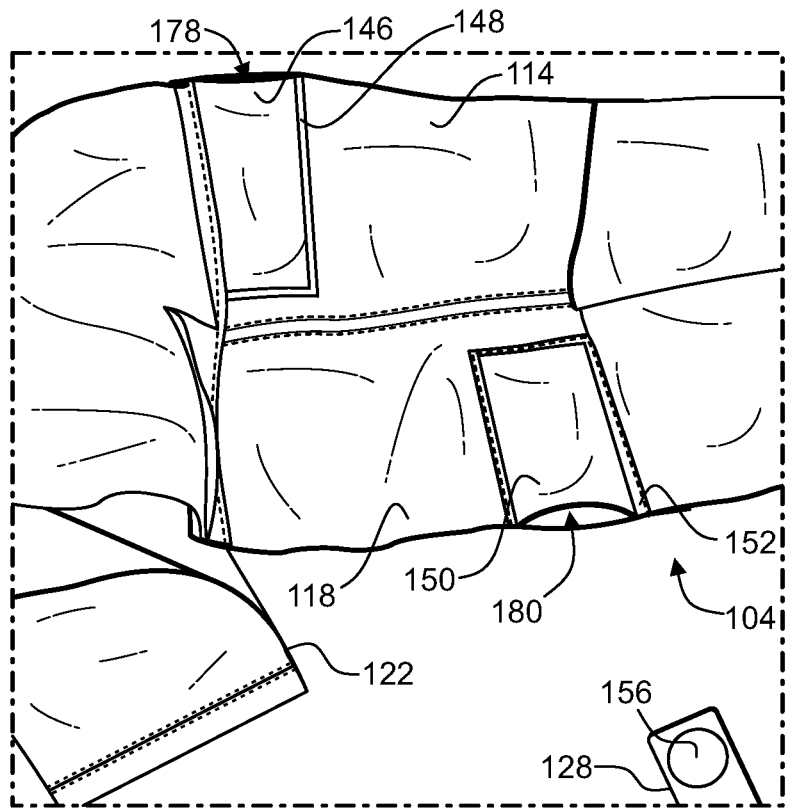
FIG. 21 is a diagrammatic partial view showing the bag of FIG. 7 cut longitudinally in half with the inner shielding liner element pulled outward of the outer bag element, thereby revealing the locations of the first and second securement elements with their peripheries heat fused to the inner faces of respective bag panel elements.
Figure 22:
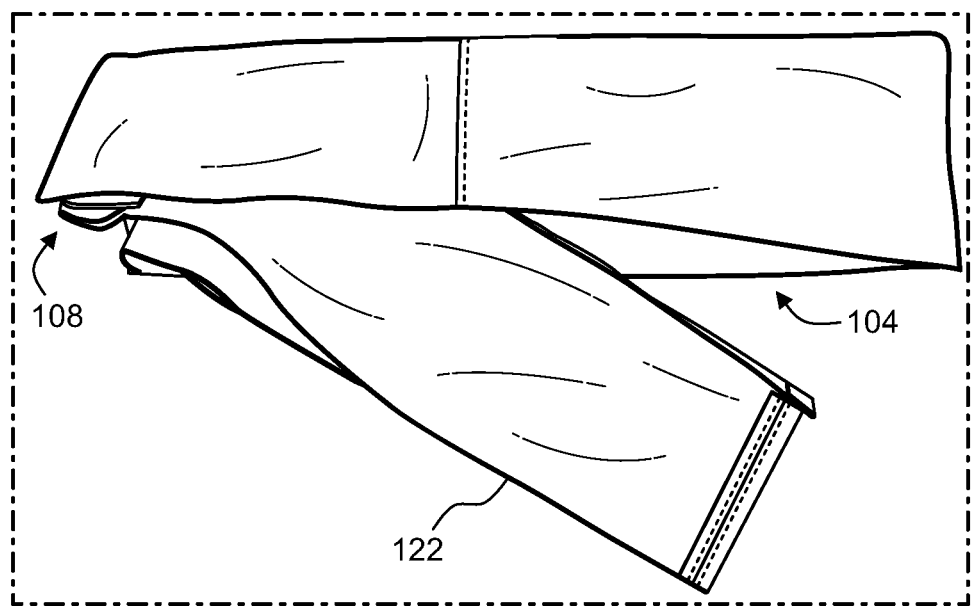
FIG. 22 is a diagrammatic partial view showing the bag of FIG. 7 cut longitudinally in half with the inner shielding liner element pulled laterally outward of the outer bag element, thereby illustrating how in this particular embodiment the inner shielding liner element is only secured to the outer bag element at the access mouth.
Figure 23:
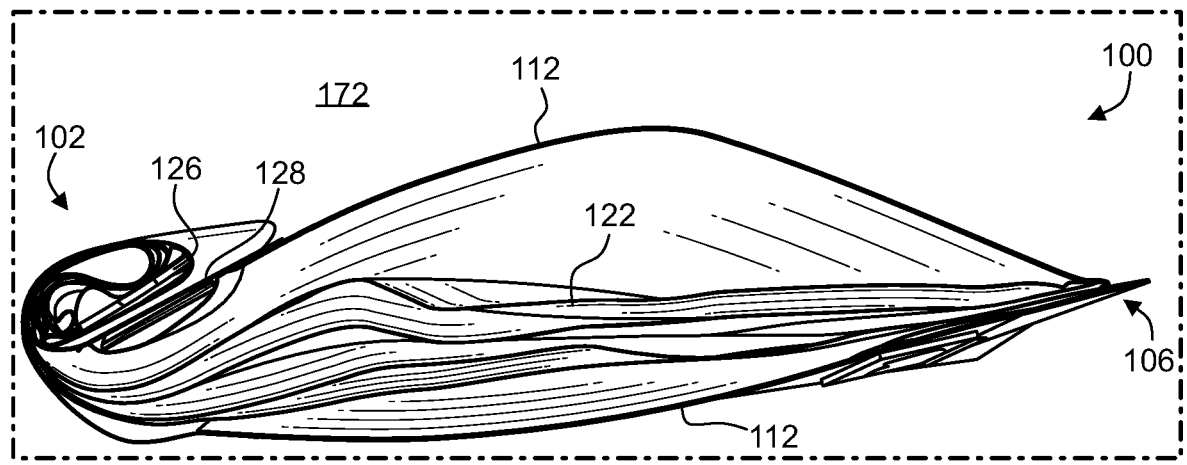
FIG. 23 is a diagrammatic cross-sectional view of the bag of FIG. 7; wherein the closure section is in a closed configuration.
Figure 24:
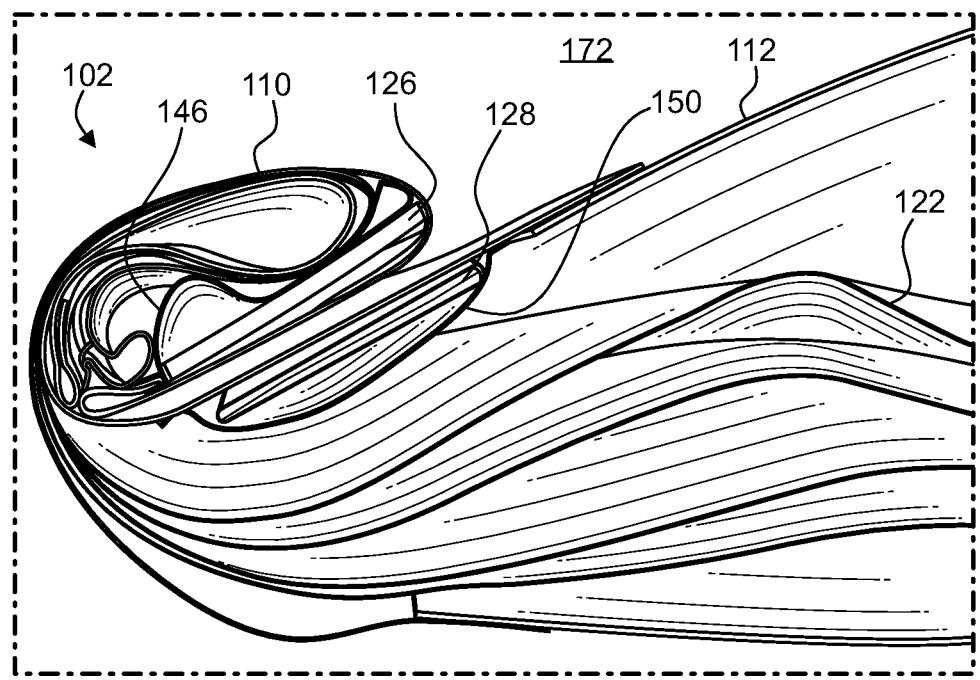
FIG. 24 is a diagrammatic magnified view of the closure section of the bag in FIG. 23, wherein the closure section is in a closed configuration.
Figure 28:
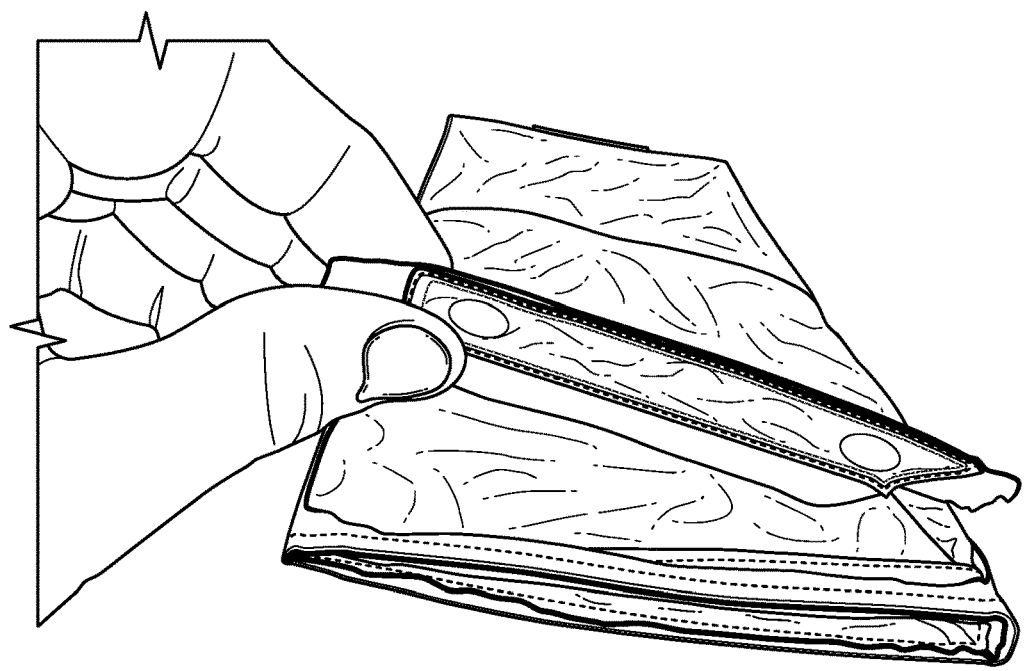
Figure 29:
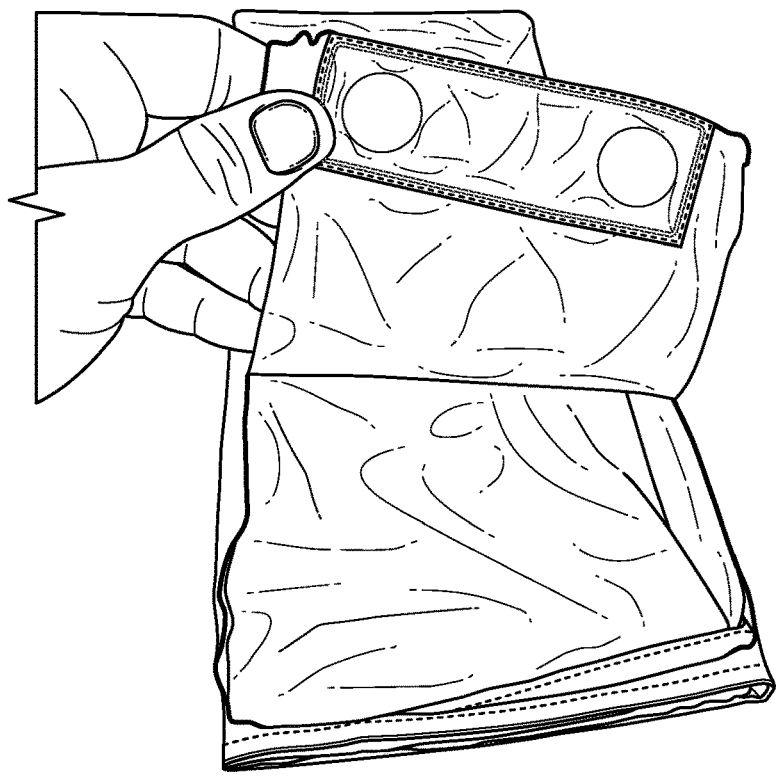

Referring to FIGS. 21, 28 and 29, to permanently secure the embedding strips with inset magnets to the outer material, backing strips of similar material may be thermally fused to the inside of the outer material, forming pockets (178 and 180) that can tightly contain the strips and maintain their position against the outer material, therefore allowing the top and bottom strips to accurately align when the closure is rolled. This method of adhesion may not penetrate the outer materials of the bag, allowing it to maintain its water-proof or water-resistant properties. Other methods of adhesion that accomplish the same goal may be used, such as RF welding, adhesive tape, or other. In other embodiments, the backing strips may not be strips at all, but instead layers of the bag or pre-formed cavities that allow the strips to permanently align with the outer layer. In other embodiments, more than one backing strip may be used to position the plastic strips with inset magnets, or may be used to simply position the magnets without the use of plastic strips. For example, a round backing strip could be thermally bound to the outer material and tightly enclose a magnet on either side of the area where the top strip is located.

Figure 30:
Figure 31:
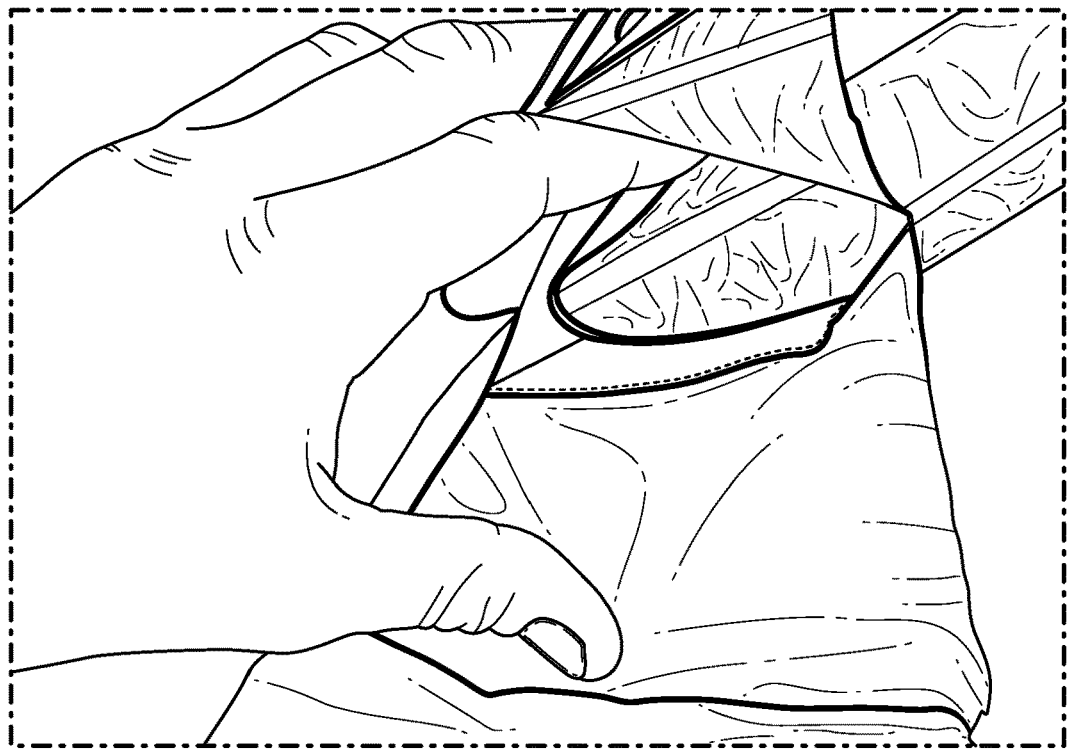
Figure 32:
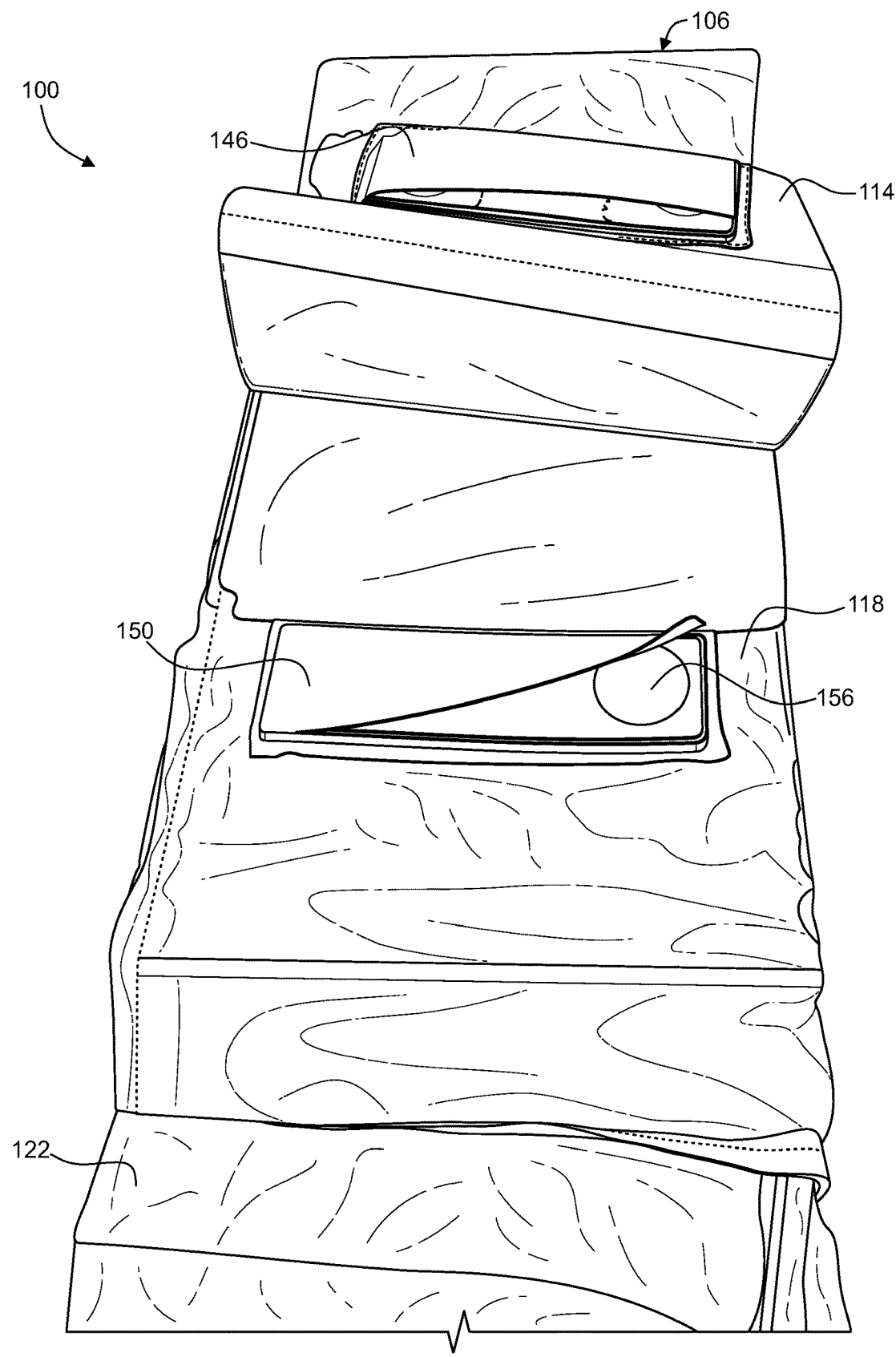
Figure 33:
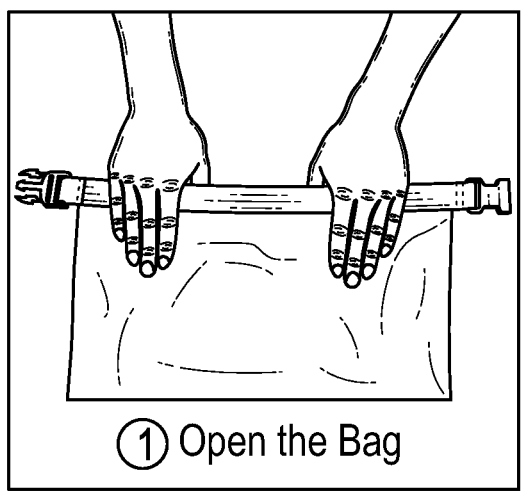
FIG. 33 is an illustration of how a typical prior art dry bag closure operates.
Figure 33:
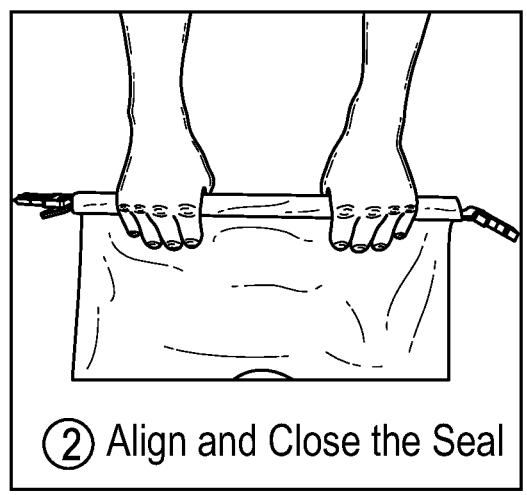
Figure 33:
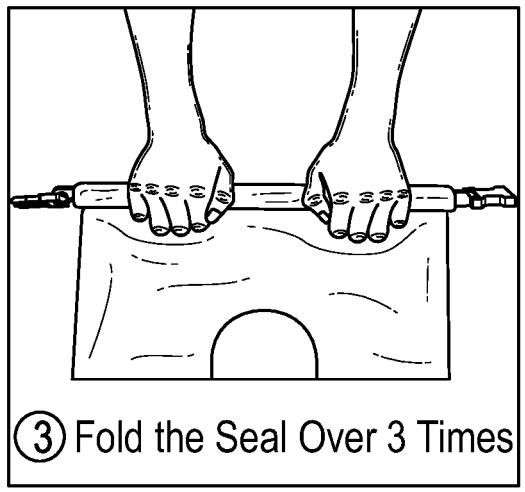
Figure 33:
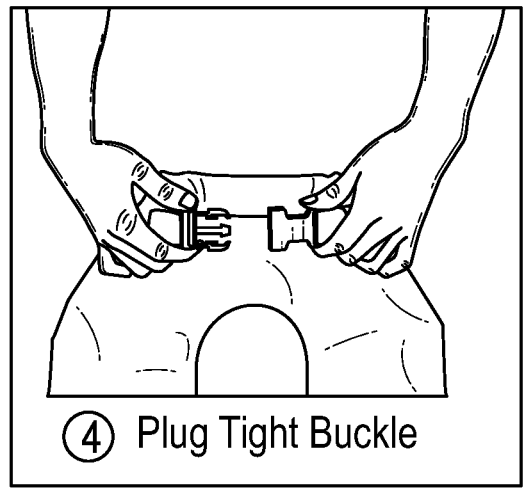

Referring to FIGS. 30-32, the inner EMI/RF liner has been inverted to show the location of the top and bottom strips in relation to the outer materials. The EMI/RF liner may be attached at the very edge of the mouth of the bag only, which may allow the liner to function as an EMI/RF enclosure separately from the function of the outer waterproof or water-resistant materials. The EMI/RF liner may not be penetrated while the strips and other materials are thermally attached to the outer materials. In other embodiments, the inner EMI/RF liner my not be attached to the outer materials at the top of the mouth, but instead at the sides, bottom, or other area, or may not even be attached at all.

The top embedding strip (otherwise referred to herein as a first embedding strip) may be located at the "front" top of the bag, while the bottom embedding strip (otherwise referred to herein as a second embedding strip) may be located lower on the "back" of the bag, in such a position that the closure can be rolled twice and the strips can make contact. Because the strips may be flush with the magnets, contact between the two strips can tightly sandwich the outer material and allow it to not only be EMI/RF sealed, but also sealed from water. In other embodiments, other materials may be used to further waterproof the bag, such as waterproof zippers which may be located at the mouth of the bag. Other embodiments may include more than two rolls, whereby the location of the strips could change. For example, the top strip could be located at the front of the bag, as well as the bottom strip. Various applications, such as forensics evidence containment could require an additional securement method, such as a button or string to ensure that the closure does not come undone.

As illustrated in the various figure herein, the embedding strips with inset magnets may not run the entire lateral width of the closure of the bag. In other embodiments, the strips may be as long as the opening of the bag, or may be shorter. They be taller or skinnier, or in any other configuration that accomplishes the same closure as the invention. Other embodiments may use strip magnets instead of individual magnets. Apertures in the embedding strips retain the magnets in fixed positions, allowing the embedding strip and the magnets embedded therein to become a single "strip". This single strip may then be sealed into the dry bag using heat welding, a method that allows the bag to maintain water-resistant/water-tight characteristics.

The following listing matches certain terminology used within this disclosure with corresponding reference numbers used in the non-limiting examples illustrated in the several figures.

100 electromagnetic shielded dry bag
102 magnetic closure system
104 outer bag element (e.g., waterproof)
106 floor portion (of outer bag element)
108 access mouth
110 first bag panel
112 second bag panel
114 first inner face (of first bag panel)
116 first outer face (of first bag panel)
118 second inner face (of second bag panel)
120 second outer face (of second bag panel)
122 inner shielding liner element (electromagnetic shielding material)
124 electromagnetic shielding compartment
126 first embedding strip
128 second embedding strip
130 first magnet element (comprised of one or more magnets)
132 second magnet element (comprised of one or more magnets)
134 first proximal face (of first embedding strip)
136 first distal face (of first embedding strip)
142a first pole face
142b first pole face (opposing)
146 first securement element
148 first securement periphery
150 second securement element
152 second securement periphery
154 lateral edges (of outer bag element)
156 cylindrical magnets (e.g., neodymium)
158 first waterproof material
160 material interface segment
162 second waterproof material
164 closure section
166 retention segment
168 distal flap segment
170 intermediate flap segment
172 ambient environment
174 pole axis
176 electronic device (e.g., cell phone, smart phone or tablet computer)
178 first strip pocket
180 second strip pocket
182 adhesive
184 tape
186 magnet-receiving apertures
200 example prior art dry bag While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An electromagnetic shielded dry bag with magnetic closure system, the electromagnetic shielded dry bag comprising:
    an outer bag element including a fluid-sealed floor portion, an access mouth disposed oppositely thereof, first and second bag panels disposed oppositely of one another and extending from the floor portion to the access mouth, the first bag panel having a first inner face and first outer face, the second bag panel having a second inner face and a second outer face;
    an inner shielding liner element comprised of electromagnetic shielding material and defining an electromagnetic shielding compartment within the bag;
    a first embedding strip;
    a second embedding strip;
    a first magnet element embedded in the first embedding strip;
    a second magnet element embedded in the second embedding strip;
    wherein the first embedding strip is in a first securement with the first inner face, and the second embedding strip is in a second securement with the second inner face.

2. An electromagnetic shielded dry bag as defined in claim 1, wherein
    (a) the first embedding strip has a first proximal face and a first distal face disposed oppositely of one another;
    (b) the second embedding strip has a second proximal face and a second distal face disposed oppositely of one another;
    (c) the first magnet element has a pair of first opposing pole faces that are respectively flush with the first proximal face and the first distal face; and
    (d) the second magnet element has a pair of second opposing pole faces that are respectively flush with the second proximal face and the second distal face.

3. An electromagnetic shielded dry bag as defined in claim 1, wherein (a) the first securement is by way of a first securement element having a first securement periphery heat fused to the first inner face; and (a) the second securement is by way of a second securement element having a second securement periphery heat fused to the second inner face.

4. An electromagnetic shielded dry bag as defined in claim 1, wherein
(a) the outer bag element includes a pair of lateral edges extending from the floor portion to the access mouth;
(b) the first magnet element includes a first plurality of cylindrical magnets extending in linear alignment with one another between the lateral edges; and
(c) the second magnet element includes a second plurality of cylindrical magnets extending in linear alignment with one another between the lateral edges.

5. An electromagnetic shielded dry bag as defined in claim 1, wherein the outer bag element is comprised of a waterproof material.

6. An electromagnetic shielded dry bag as defined in claim 1, wherein the outer bag element is comprised of a first waterproof material extending from the floor portion to a material interface segment, and a second waterproof material extending from the access mouth to the material interface segment, the first and second waterproof materials being materially distinct from one another.

7. An electromagnetic shielded dry bag as defined in claim 6, wherein the first waterproof material is a 600D TPU and the second waterproof material is a 420D TPU.

8. An electromagnetic shielded dry bag as defined in claim 1, wherein the embedding strips are comprised of a polymer.

9. An electromagnetic shielded dry bag as defined in claim 1, wherein the inner shielding liner element is secured to the outer bag element at the access mouth.

10. An electromagnetic shielded dry bag as defined in claim 9, wherein other than at the access mouth, no stitching exists between the inner shielding liner element and the outer bag element.

11. An electromagnetic shielded dry bag as defined in claim 1, wherein a closure section is defined between the shielding compartment and the access mouth, the closure section including a retention segment, a distal flap segment, and an intermediate flap segment therebetween, the distal flap segment being foldably associated with the intermediate flap segment, the intermediate flap segment being foldably associated with the retention segment, the closure section being selectively actuatable between an open configuration and a closed configuration;

wherein
(a) when the closure section is in the open configuration
(i) the first magnet element is out of attractive magnetic engagement with the second magnet element, and
(ii) the shielding compartment is accessible from an ambient environment by way of the access mouth; and
(b) when the closure section is in the closed configuration
(i) the distal flap segment is folded with respect to the intermediate flap segment,
(ii) the intermediate flap segment is folded with respect to the retention segment,
(iii) the first magnet element is in attractive magnetic engagement with the second magnet element, and
(iv) the access mouth is retained in an electromagnetically-sealed and water-blocking configuration.

12. A faraday bag as defined in claim 11 wherein
(a) the first magnet element and the second magnet element each include a plurality of circular-cylindrical magnets each of which are axially-magnetized along a corresponding pole axis, and
(b) when the closure section is in the closed configuration, the pole axis of each magnet of the first magnet element is axially aligned with the pole axis of a respective magnet of the second magnet element.

* * * * *